United States Patent [19]

Yokoo et al.

[11] Patent Number: 5,635,842
[45] Date of Patent: Jun. 3, 1997

[54] METHOD OF ESTIMATING RESIDUAL CAPACITY OF BATTERY

[75] Inventors: Masahide Yokoo; Masao Nagano; Hideharu Takemoto, all of Saitama-ken, Japan

[73] Assignee: Honda Giken Kogyo Kabushiki Kaisha, Tokyo, Japan

[21] Appl. No.: 595,448

[22] Filed: Feb. 5, 1996

Related U.S. Application Data

[63] Continuation of Ser. No. 269,404, Jun. 30, 1994, abandoned.

[30] Foreign Application Priority Data

Jun. 30, 1993  [JP]  Japan ..................... 5-160647

[51] Int. Cl.$^6$ ..................... G01N 27/46
[52] U.S. Cl. ............... 324/427; 324/429; 324/430; 320/48; 320/43; 340/636
[58] Field of Search ............. 320/48, 43; 340/636; 324/429, 430, 427

[56] References Cited

U.S. PATENT DOCUMENTS

| | | | |
|---|---|---|---|
| 3,680,072 | 7/1972 | Charbonnier | 320/43 |
| 3,808,522 | 4/1974 | Sharaf | 324/430 |
| 4,423,378 | 12/1983 | Marino | 324/429 |
| 4,678,998 | 7/1987 | Muramatsu | 320/43 |
| 4,849,700 | 7/1989 | Morioka | 324/427 |
| 5,140,269 | 8/1992 | Champlin | 320/43 |
| 5,281,919 | 1/1994 | Palanisamy | 324/430 |
| 5,325,041 | 6/1994 | Briggs | 320/48 |

FOREIGN PATENT DOCUMENTS 1390669  8/1989  Japan.

*Primary Examiner*—Kenneth A. Wieder
*Assistant Examiner*—Jose M. Solis
*Attorney, Agent, or Firm*—Lyon & Lyon LLP

[57] ABSTRACT

In estimating the residual capacity of a battery according to the maximum output estimating process, a reference point is established in advance at the intersection of a plurality of current/voltage characteristic linear curves corresponding to various residual capacities of the battery or in an area in the vicinity of the intersections of the curves. A current/voltage characteristic linear curve is determined so as to pass through the reference point and a measured operating point of the battery which corresponds to the present discharging current and output voltage values measured when the battery is discharged. Then, a maximum transfer power value of the battery is determined from the current/voltage characteristic linear curve thus determined, and the present residual capacity of the battery is estimated from the maximum transfer power value.

19 Claims, 5 Drawing Sheets

METHOD OF ESTIMATING RESIDUAL CAPACITY OF BATTERY

This application is a Continuation of application Ser. No. 08/269,404, filed on Jun. 30, 1994, now abandoned.

BACKGROUND OF THE INVENTION

1. Field of the Invention

The present invention relates to a method of estimating the residual capacity of a battery (secondary cell) such as a lead-acid storage battery, a nickel-cadmium battery, or the like on a real-time basis.

2. Description of the Prior Art

There has heretofore been known a maximum output estimating process as a method of estimating the residual capacity of a battery, as disclosed in Japanese patent publication No. 1-39069, for example.

The maximum output estimating process is based on the fact that the current and voltage characteristics of a battery as it is discharged vary depending on the residual capacity of the battery. The principles of the maximum output estimating process are described below.

FIG. 6 of the accompanying drawings illustrates the principles of the maximum output estimating process for a lead storage battery. In FIG. 6, the relationship between a discharging current and an output voltage of the lead storage battery at any given residual capacity, i.e., the current/voltage characteristic of the battery, is such that the output voltage decreases linearly as the discharging current increases, as indicated by a linear characteristic curve "a" (solid line). When the residual capacity of the battery decreases, the current/voltage characteristic curve moves downwardly from the linear characteristic curve "a" toward the horizontal axis representing the discharging current, as indicated by a linear characteristic curve "b" (dashed line). Such a current/voltage characteristic tendency is generally found on other batteries such as a nickel-cadmium battery as well as the lead-acid storage battery.

If the residual capacity of the battery corresponds to the current/voltage characteristic linear curve "a", and since at any point in time of use the battery is being discharged at an operating point on the current/voltage characteristic linear curve "a", the value of maximum transfer power that can be extracted from the battery may be determined according to the following equation (1):

$$\text{Maximum transfer power value} = (\tfrac{1}{4}) \cdot V_{max} \cdot I_{max} \quad (1)$$

where Vmax and Imax are maximum values of the output voltage and the discharging current, respectively, at the operating point on the current/voltage characteristic linear curve "a". The maximum value of the output voltage is determined as an output voltage value at the time the discharging current value in a linear equation which represents the current/voltage characteristic linear curve "a" is "0", and the maximum value of the discharging current is determined as a discharging current value at the time the output voltage value in the linear equation which represents the current/voltage characteristic linear curve "a" is "0".

Because the current/voltage characteristic linear curve "a" tends to vary depending on the residual capacity of the battery, as described above, the maximum transfer power value determined according to the equation (1) and the residual capacity of the battery are correlated to each other such that the maximum transfer power value decreases as the residual capacity of the battery is lowered. Therefore, if the correlation between the maximum output energy value and the residual capacity of the battery is known, then it is possible to estimate the present residual capacity of the battery from the maximum transfer power value thereof.

According to the conventional maximum output estimating process, when the battery is discharged, a plurality of sets, or at least two sets, of discharging current and output voltage values are measured at sufficiently short intervals of time, and a linear equation which represents the current/voltage characteristic linear curve is determined from the measured sets of discharging current and output voltage values. Then, maximum values Vmax, Imax of the output voltage and the discharging current are determined from the linear equation, and the present maximum output or transfer power value is determined from the maximum values Vmax, Imax according to the equation (1). The present residual capacity of the battery is estimated from the determined maximum transfer power value.

When the residual capacity of the battery is estimated according to the conventional maximum output estimating process, since the linear equation representative of the current/voltage characteristic linear curve is determined from the measured sets of discharging current and output voltage values, it is preferable for the measured discharging current values to have relatively large differences. This is because if the measured discharging current values were the same, then it would be impossible to determine a linear equation representative of the current/voltage characteristic linear curve, and if the measured discharging current values had relatively small differences, then determined current/voltage characteristic linear curves would have large variations due to the accuracy with which the discharging current and output voltage values are measured and the accuracy with which the current/voltage characteristic linear curves are calculated. For example, when a plurality of sets of discharging current and output voltage values are measured at the time the discharging current of the battery does not vary substantially, the measured sets P of discharging current and output voltage values concentrate in an area where the differences between the discharging current values are small as shown in FIG. 6. In such a case, although an equation representative of the current/voltage characteristic linear curve is determined using the method of least squares, for example, the current/voltage characteristic linear curve may be determined as indicated by dash-dot lines (c) or (d), resulting in large variations, depending on small changes in the measured sets P. Thus, when the maximum transfer power value of the battery is determined from the current/voltage characteristic linear curve with closely grouped sets P, the residual capacity of the battery cannot properly be estimated.

As disclosed in Japanese patent publication No. 1-39069, the discharging current value of a battery which is mounted on an internal combustion engine-powered automobile varies relatively greatly when the engine is started, and hence it is possible to measure a plurality of sets of discharging current and output voltage values such that the differences between the discharging currents are relatively large. Therefore, it is possible to determine relatively accurately a current/voltage characteristic linear curve which corresponds to the residual capacity of the battery at the time the engine is started. While the engine-powered automobile is running, the battery is charged by the alternator, and hence it is difficult to estimate the residual capacity of the battery according to the maximum output estimating process. However, almost no problem arises as a result of that difficulty because there is no need to recognize the residual capacity of the battery while the battery is being charged.

Estimating the residual capacity of a battery mounted on an electric vehicle according to the above-described conventional maximum output estimating process has suffered the following disadvantages. The residual capacity of a battery mounted on an electric vehicle directly affects the running performance of the electric vehicle such as the distance or range which the electric vehicle can travel. It is therefore extremely important to be able to recognize the residual capacity of the battery from time to time. On the other hand, when the electric vehicle is running at a constant speed, the discharging current from the battery does not vary substantially. Even if an attempt is made to estimate the residual capacity of the battery on the electric vehicle according to the maximum output estimating process, it is often very difficult or impossible to measure a plurality of sets of discharging current and output voltage values such that the differences between the discharging currents are relatively large. Accordingly, as described above, the determined current/voltage characteristic linear curve tends to suffer large variations, and it is difficult to estimate the residual capacity of the battery accurately from time to time.

Such drawbacks experienced with the estimation of the residual capacity of a battery are not limited to electric vehicles, but are found on those vehicles which use batteries under a condition in which the discharging current thereof does not vary substantially.

SUMMARY OF THE INVENTION

It is therefore an object of the present invention to provide a method of estimating the residual capacity of a battery reliably and accurately according to the maximum output estimating process.

As a result of various analyses, the inventors have discovered that when current/voltage characteristic linear curves obtained at various residual capacities of a battery are extended to a region where discharging current values are negative, the current/voltage characteristic linear curves converge to a point or an area in the vicinity of such a point, and hence pass through substantially the same point.

To achieve the above object, there is provided in accordance with the present invention a method of estimating the residual capacity of a battery, comprising the steps of measuring a discharging current and an output voltage of a battery when the battery is being discharged, determining a current/voltage characteristic linear curve representing the relationship between a present discharging current and a present output voltage of the battery based on the discharging current and the output voltage which are measured, determining a maximum transfer power value of the battery from the current/voltage characteristic linear curve when the battery is discharged according to the current/voltage characteristic linear curve, establishing a reference point at the intersection of a plurality of current/voltage characteristic linear curves corresponding to respective residual capacities of the battery or in an area in the vicinity of the intersections of those curves, determining the current/voltage characteristic linear curve so as to pass through the reference point and a measured operating point of the battery which corresponds to the discharging current and the output voltage values which are measured when the battery is being discharged, and estimating a present residual capacity of the battery from the determined maximum transfer power value.

The method further comprises the steps of measuring a plurality of sets of the discharging current and the output voltage of the battery when the battery is being discharged, and determining the current/voltage characteristic linear curve so as to pass through the reference point and measured operating points of the battery which correspond to the sets of the discharging current and the output voltage values which are measured.

The method further comprises the steps of determining the averages of the measured discharging current and the measured output voltage values in the sets, and determining the current/voltage characteristic linear curve so as to pass through the reference point and an average measured operating point of the battery which corresponds to the average of the measured discharging current values and the measured output voltage values.

The reference point is a point where current/voltage characteristic linear curves corresponding to various residual capacities of the battery converge, and a current/voltage characteristic linear curve at any particular or given residual capacity passes through the reference point. In estimating the residual capacity of the battery, therefore, it is possible to obtain the current/voltage characteristic linear curve corresponding to the present residual capacity by determining the current/voltage characteristic linear curve so as to substantially pass through the reference point and a measured operating point of the battery which corresponds to the discharging current and output voltage values which are measured when the battery is being discharged.

Since a linear curve is determined if two points are given, one set of discharging current and output voltage values may be measured, and the current/voltage characteristic linear curve may be determined which passes through the reference point and a single measured operating point corresponding to the measured set of discharging current and output voltage values. However, it is preferable to measure a plurality of sets of discharging current and output voltage values, and determine the current/voltage characteristic linear curve so as to substantially pass through the reference point and measured operating points of the battery which correspond to the sets of discharging current and output voltage values which are measured. In this manner, any effect of measurement errors or the like of the discharging current and the output voltage is reduced to allow the current/voltage characteristic linear curve corresponding to the present residual capacity to be obtained highly accurately.

When a plurality of sets of discharging current and output voltage values are measured, the current/voltage characteristic linear curve may be determined using the reference point and the measured operating points according to the method of least squares. However, the average of the measured discharging current and output voltage values of the sets may be determined, and the current/voltage characteristic linear curve may be determined so as to pass through the reference point and an average measured operating point of the battery which corresponds to the average of the measured discharging current values and the average of the measured output voltage values. In this fashion, the calculating process for determining the current/voltage characteristic linear curve can thus be simplified.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

INVENTIVE EXAMPLE 1

A method of estimating the residual capacity of a battery according to a first embodiment will be described below with reference to FIGS. 1A–1C through 3.

The inventors discharged a lead-acid storage test battery (hereinafter referred to as a "battery") having a rated capacity of 50 Ah from a fully charged condition while varying a discharging current to various values under a certain temperature condition, and measured the discharging current and output voltage (voltage across the battery terminals) at each sampling time of 0.6 sec. Each time a certain number, i.e. 480, of measured data were obtained, a current/voltage characteristic linear curve was determined from the measured values of the discharging current and output voltage according to the method of least squares, for example. The discharging current varied in the range of from 0 to 70 A.

Figure 1A:
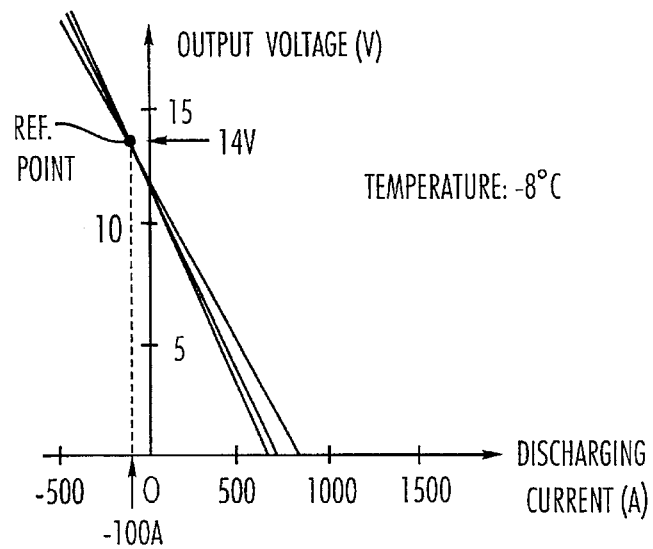
FIGS. 1A through 1C are diagrams illustrative of a method of estimating the residual capacity of a battery according to a first embodiment of the present invention.
Figure 1B:
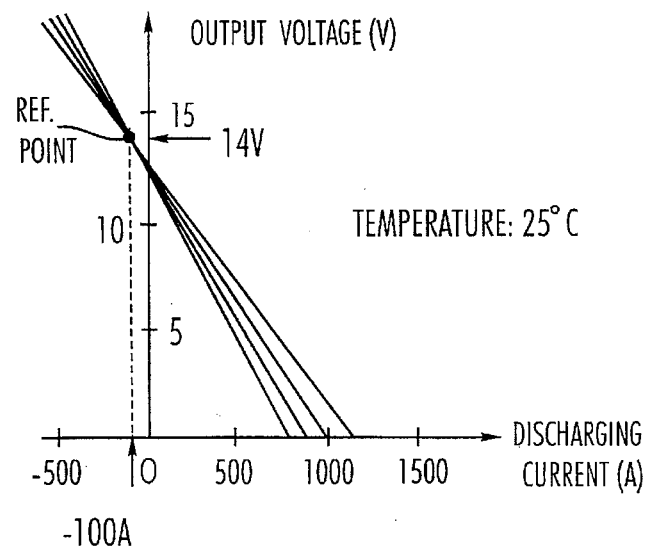
Figure 1C:
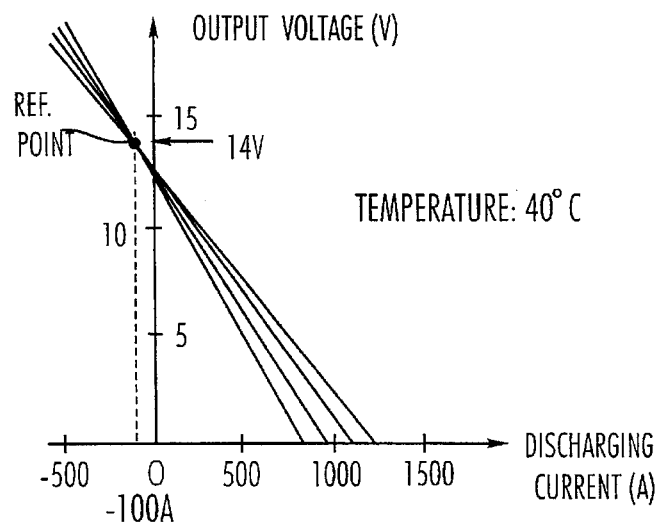

The results of the above experiment are shown in FIGS. 1A through 1C. FIGS. 1A through 1C show the current/voltage characteristic linear curves determined when the temperature of the battery was −8° C., 25° C., and 40° C., respectively. Each of the graphs shown in FIGS. 1A through 1C has a horizontal axis representing the discharging current and a vertical axis representing the output voltage.

It can be seen from FIGS. 1A through 1C that the gradient of the current/voltage characteristic linear curve increases as the battery is progressively discharged, i.e., as the residual capacity of the battery decreases. Various current/voltage characteristic linear curves corresponding to various residual capacities converge in an area where the discharging current values are negative. In that area, the discharging current value is in the range of from −200 A to −100 A, and the output voltage value is in the range of from 13 V to 15 V.

The inventors have established a reference point through which all the current/voltage characteristic linear curves at any particular or given residual capacity substantially pass, the reference point being positioned at a location indicated by the discharging current value of −100 A and the output voltage value of 14 V.

Then, the inventors discharged the same battery from a fully charged condition while varying the discharging current to various values at battery temperatures of −8° C., 25° C., and 40° C., and measured the discharging current and output voltage (voltage across the battery terminals) at each sampling time of 0.6 sec. Each time a certain number, e.g. 50, of measured data were obtained, an equation of a current/voltage characteristic linear curve was determined from the 50 measured values of the discharging current and output voltage and the reference point (−100 A, 14 V) according to the method of least squares, for example. The current/voltage characteristic linear curve is expressed by the following equation (2):

$$V = aI + b \quad (2)$$

where I is the discharging current value, V the output voltage value, and "a", "b" unknown numbers determined from the measured discharging current and output voltage values and the reference point.

The maximum output or transfer power value was determined from the equation (2) according to the equation (1) as follows:

$$\text{Maximum transfer power value} = (\tfrac{1}{4}) \cdot V_{max} \cdot I_{max} \quad (1)$$

where $V_{max}$ is the value (=b) of the voltage V at the time I=0 in the equation (2), and $I_{max}$ is the value (=−b/a) of the current I at the time V=0 in the equation (2).

Figure 2A:
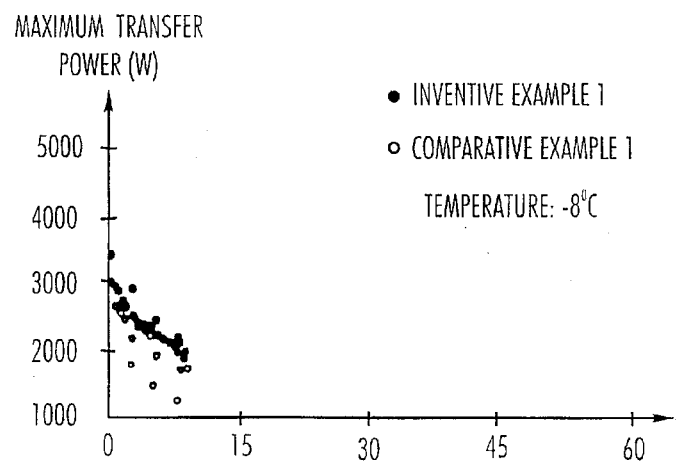
FIGS. 2A through 2C are diagrams illustrative of the method of estimating the residual capacity of a battery according to the first embodiment.
Figure 2B:
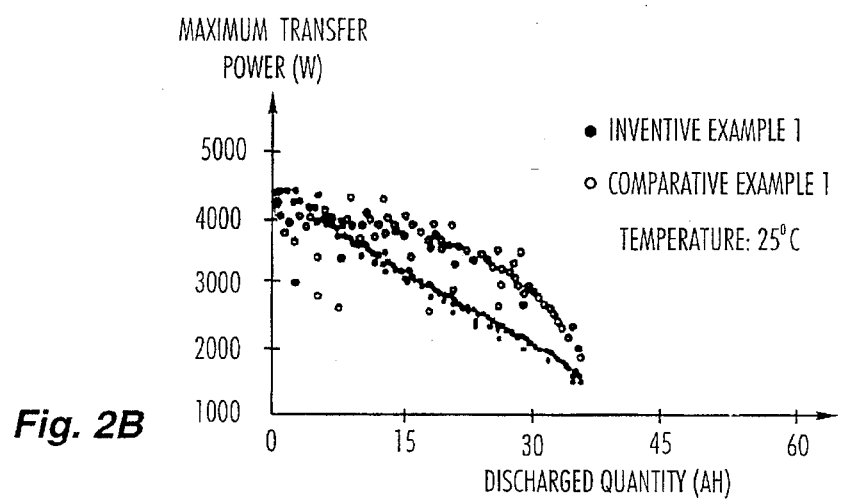
Figure 2C:
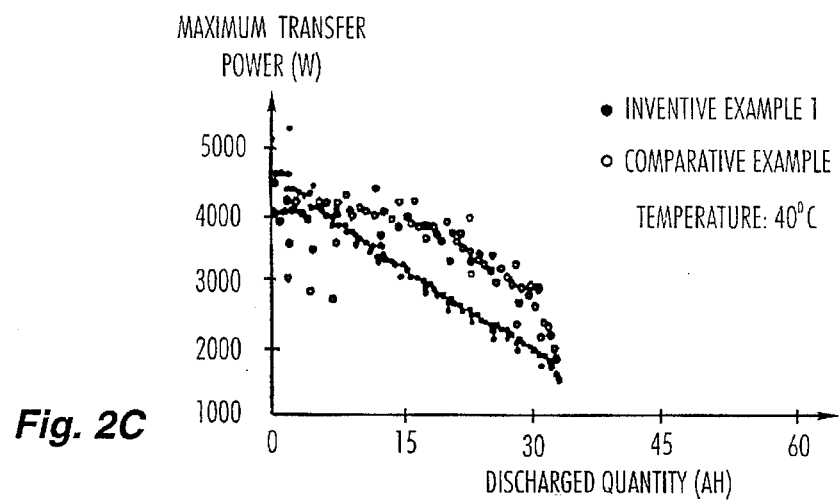

The maximum transfer power value thus determined varies as indicated by solid dots "•" in FIGS. 2A through 2C. In FIGS. 2A through 2C, the horizontal axis represents the discharged quantity, and the vertical axis the maximum transfer power value. The discharged quantity is an integrated value of discharging current values measured at each sampling time. As the discharged quantity increases, the residual capacity of the battery decreases.

As can be understood from FIGS. 2A through 2C, the maximum transfer power value is reduced as discharged quantity increases, i.e., as the residual capacity of the battery decreases. When the battery temperature is −8° C., the maximum transfer power value is smaller than when the battery temperature is 25° C. and 40° C., indicating that the effective residual capacity of the battery is lower in a low battery temperature range.

Figure 3:
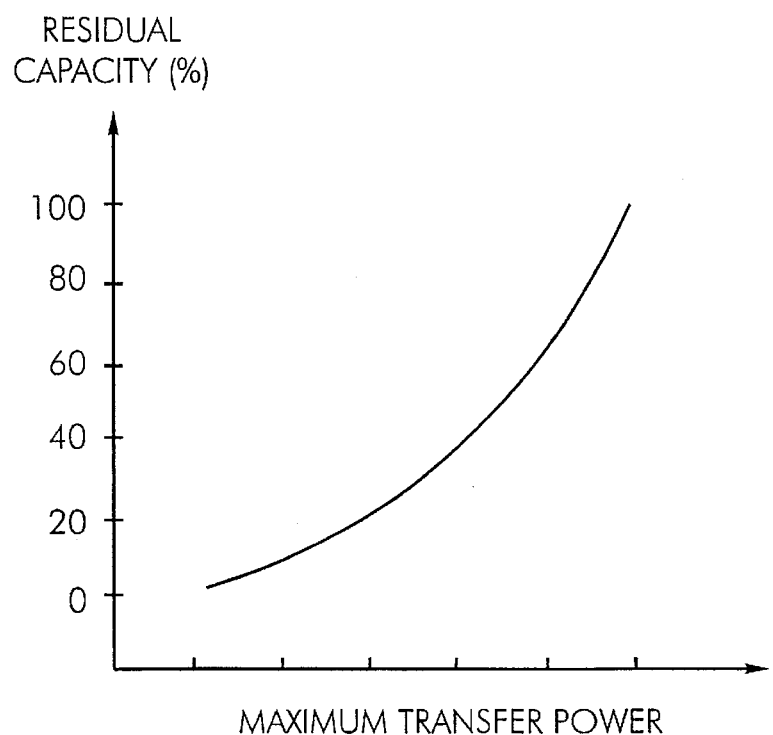
FIG. 3 is a diagram illustrative of the method of estimating the residual capacity of a battery according to the first embodiment.
Figure 6:
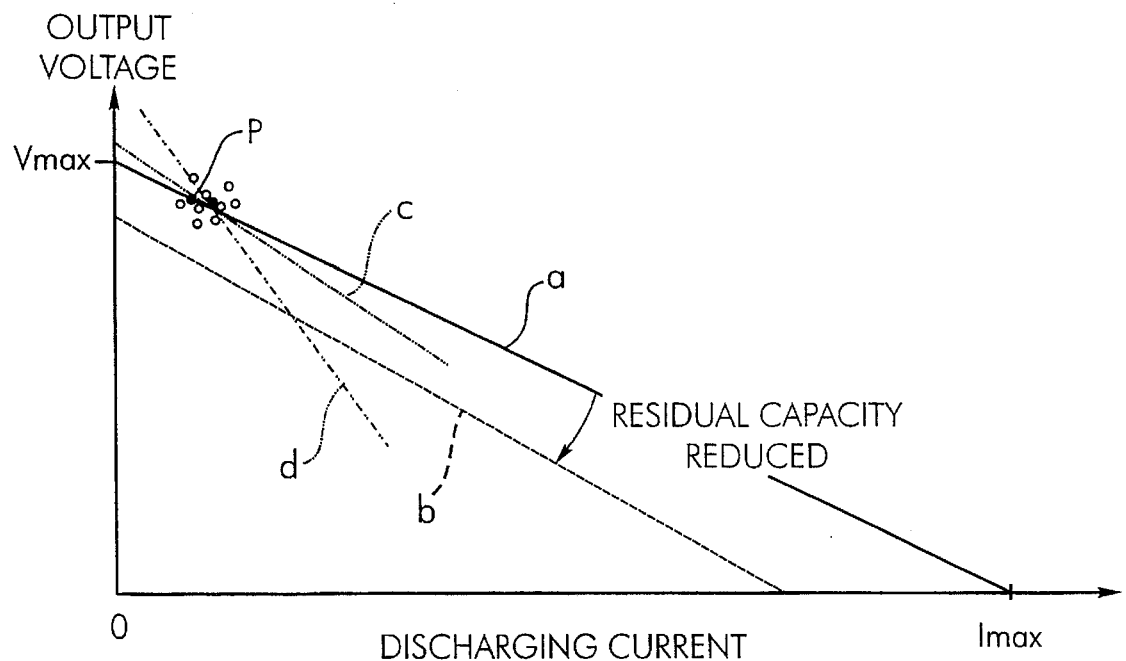
FIG. 6 is a diagram illustrative of the principles of a maximum output estimating process.

Thereafter, the inventors estimated the residual capacity of the battery from a characteristic table shown in FIG. 3, for example, and the maximum transfer power value, depending on the battery temperature. The characteristic table shown in FIG. 3 is determined as representing the relationship between the maximum transfer power value and the residual capacity based on various experiments, and illustrates the basic tendency that the residual capacity is greater as the maximum transfer power value is greater.

COMPARATIVE EXAMPLE 1

Concurrent with the determination of the current/voltage characteristic linear curves using the reference point in the Inventive Example 1 above, each time the measured values of the discharging current and output voltage were obtained, the inventors determined a current/voltage characteristic linear curve using only these measured values (i.e. without using the reference point) according to the method of least squares, and determined a maximum transfer power value from the determined current/voltage characteristic linear curve in the same manner as the Inventive Example 1. The maximum transfer power value thus determined varies as indicated by the small circles "o" in FIGS. 2A through 2C.

A comparison between the Inventive Example 1 and the Comparative Example 1 in FIGS. 2A through 2C shows that the obtained maximum transfer power value suffers large variations in the Comparative Example 1 where the maximum transfer power value was obtained without using the reference point, and that the maximum transfer power value in the Comparative Example 1 may vary greatly when the discharged quantity from the fully charged battery varies slightly, i.e., when the residual capacity of the battery varies slightly.

In the Inventive Example 1 where the maximum transfer power value was obtained using the reference point, any variations of the obtained maximum transfer power value are very small, and the maximum transfer power value decreases relatively smoothly when the discharged quantity from the fully charged battery increases, i.e., when the residual capacity of the battery decreases. In the Inventive Example 1, therefore, the maximum transfer power value corresponding to a certain residual capacity of the battery can be determined as being substantially constant at all times, and the residual capacity of the battery can be estimated highly accurately from the maximum transfer power value using the characteristic table shown in FIG. 3.

Any variations in the obtained maximum transfer power value which is determined using the reference point are made very small because there is a large difference between the discharging current value of −100 A at the reference point and the measured value, ranging from 0 A to several hundred A, of the discharging current measured in determining the maximum transfer power value. Since the discharging current value at the reference point and the measured value of the discharging current differ greatly from each other, even when the battery is discharged such that a plurality of measured values of discharging current do not vary substantially, current/voltage characteristic linear curves determined so as to substantially pass through the reference point have reduced variations, allowing the maximum output value to be determined highly accurately for estimating the residual capacity of the battery.

While the residual capacity of the battery is estimated from the maximum transfer power value using the characteristic table shown in FIG. 3 in the Inventive Example 1, the relationship between the maximum transfer power value and the residual capacity as indicated by the characteristic table shown in FIG. 3 may be approximated by an equation of higher degree, e.g., a quadratic or cubic equation, and the residual capacity of the battery may be estimated from the maximum transfer power value using the approximating equation.

INVENTIVE EXAMPLE 2

A method of estimating the residual capacity of a battery according to a second embodiment will be described below with reference to FIGS. 4A and 4B.

The inventors discharged a lead-acid storage test battery (hereinafter referred to as a "battery") having a rated capacity of 60 Ah from a fully charged condition while varying a discharging current to various values at a battery temperature of 20° C., and measured the discharging current and output voltage (voltage across the battery terminals) at each sampling time of 0.6 sec. Each time a certain number, e.g. 50, of measured data were obtained, an equation of a current/voltage characteristic linear curve was determined from the 50 measured values of the discharging current and output voltage and a predetermined reference point. As with the Inventive Example 1, current/voltage characteristic linear curves corresponding to various residual capacities of the battery were determined, and a reference point through which these current/voltage characteristic linear curves substantially pass was established as represented by a discharging current value of −150 A and an output voltage value of 14 V.

To determine a current/voltage characteristic linear curve using the reference point (−150 A, 14V), the averages of the 50 measured values of the discharging current and output voltage were determined, and a current/voltage characteristic linear curve was determined so as to pass through an operating point (average measured operating point) of the battery which corresponds to the averages of the 50 measured values of the discharging current and output voltage and also through the reference point. If it is assumed that the discharging current value and the output voltage value at the reference point are indicated by $I_O$ and $V_O$, respectively, the average of the measured discharging current value is indicated by $I_X$, and the average of the measured output voltage value is indicated by $V_X$, then an equation of a current/voltage characteristic linear curve passing through the average measured operating point and the reference point is given as follows:

$$V=[(V_O-V_X)/(I_O-I_X)]\cdot I+[(V_X I_O-V_O I_X)/(I_O-I_X)] \quad (3).$$

A maximum transfer power value was then determined from the above equation of a current/voltage characteristic linear curve in the same manner as with the Inventive Example 1. The maximum transfer power value thus determined varies as shown in FIG. 4A.

As with the Inventive Example 1, the residual capacity of the battery was estimated from the determined maximum transfer power value using a predetermined characteristic table, such as FIG. 3.

COMPARATIVE EXAMPLE 2

Concurrent with the determination of the current/voltage characteristic linear curve using the reference point in the Inventive Example 2 above, each time the 50 measured values of the discharging current and output voltage were obtained, the inventors determined current/voltage characteristic linear curves using these measured values and the reference point, and determined a maximum transfer power value from the determined current/voltage characteristic linear curves in the same manner as the Inventive Example 1. The maximum transfer power value thus determined varies as shown in FIG. 4B.

Figure 4A:
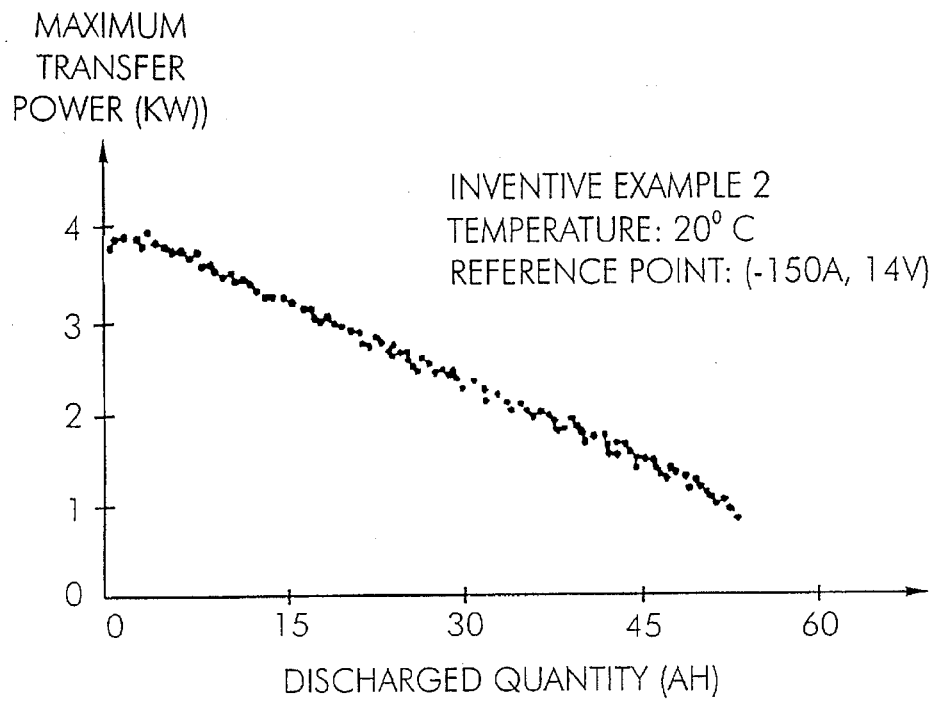
FIGS. 4A and 4B are diagrams illustrative of a method of estimating the residual capacity of a battery according to a second embodiment of the present invention.
Figure 4B:
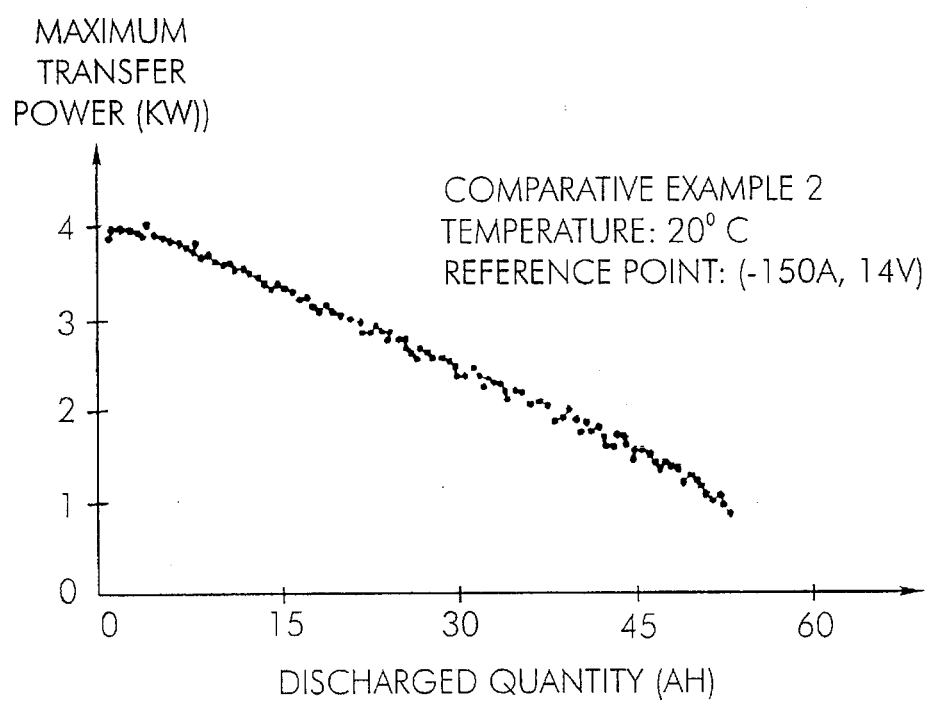

A comparison between the Inventive Example 2 and the Comparative Example 2 in FIGS. 4A and 4B shows that there is no substantial difference between the obtained maximum transfer power values in the Inventive Example 2 and the Comparative Example 2, and that in either Inventive Example 2 or the Comparative Example 2, any variations of the obtained maximum transfer power value are very small, and the maximum transfer power value decreases relatively smoothly when the discharged quantity from the fully charged battery increases, i.e., when the residual capacity of the battery decreases. It follows, therefore, that substantially the same maximum transfer power value can be obtained highly accurately irrespective of whether a current/voltage characteristic linear curve is determined using the measured values of discharging current and output voltage and the reference point according to the method of least squares as with the Inventive Example 1 or a current/voltage characteristic linear curve is determined from the average of the measured values of discharging current and output voltage and the reference point as with the Inventive Example 2. According to the procedure of the Inventive Example 2, it is possible to determine a current/voltage characteristic linear curve through simpler calculations than the procedure of the Inventive Example 1 which employs the method of least squares, allowing the maximum transfer power value corresponding to the residual capacity of the battery to be obtained easily with high accuracy.

In the above embodiments, the present invention has been described with respect to a lead-acid storage battery.

However, the principles of the present invention are also applicable to other batteries such as a nickel-cadmium battery whose current/voltage characteristic linear curve depending on the residual capacity thereof converges substantially to one point. The reference point, current/voltage characteristic linear curve, maximum transfer power and residual capacity data developed from the experiments on the battery, as a test battery, may then be used in connection with that battery or a like battery, such as an operating battery in an electric vehicle, for estimating the present residual capacity of the operating battery at any time by simply measuring the present current and voltage.

While a plurality of sets of discharging current and output voltage values are measured to determine a current/voltage characteristic linear curve in the above embodiments, only one set of values of discharging current and output voltage needs to be measured because a current/voltage characteristic linear curve can be determined if only two points are determined, and one of the two points may be the reference point. However, in view of measurement errors and limited calculation accuracy, it is preferable to measure a plurality of sets of discharging current and output voltage values as described for the above examples.

In the above examples, a plurality of sets of discharging current and output voltage values at various residual capacities of a battery are measured, and a reference point for determining a current/voltage characteristic linear curve is determined based on current/voltage characteristic linear curves determined from the measured sets of discharging current and output voltage values. However, a reference point may also be determined as set forth below.

Figure 5A:
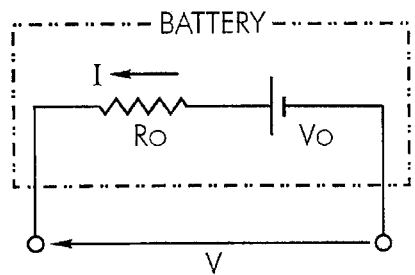
FIGS. 5A through 5C are diagrams showing a process of determining a reference point according to the present invention.
Figure 5B:
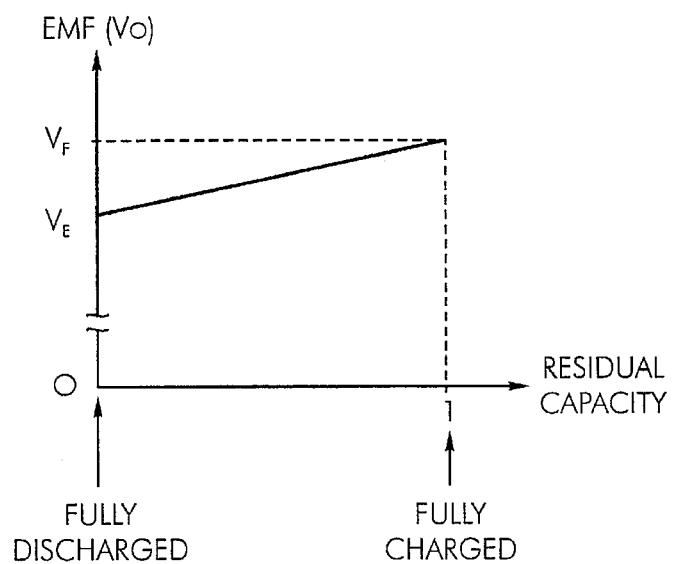
Figure 5C:
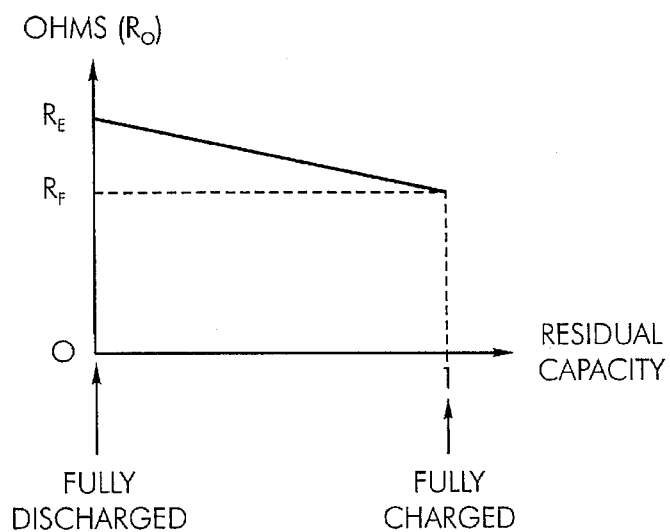

If an electromotive force (open voltage) of a lead-acid storage battery at the time it has no load is indicated by $V_O$ and an internal resistance of the battery is indicated by $R_O$, then the battery is expressed by an equivalent circuit as shown in FIG. 5A. In the lead-acid storage battery, the electromotive force $V_O$ and the internal resistance $R_O$ vary linearly with respect to the residual capacity C as shown in FIGS. 5B and 5C, respectively. In FIG. 5B, $V_F$ represents an open voltage at the time the battery is fully charged, and $V_E$ an open voltage at the time the battery is fully discharged. In FIG. 5C, $R_F$ represents an internal resistance at the time the battery is fully charged, and $R_E$ represents an internal resistance at the time the battery is fully discharged. In FIGS. 5B and 5C, the residual capacity C represented by the horizontal axis has a value "1" when the battery is fully charged, and a value "0" when the battery is fully discharged.

As is apparent from FIGS. 5B and 5C, the electromotive force $V_O$ and the internal resistance $R_O$ at any given residual capacity C are expressed by the following respective equations (4) and (5):

$$V_O = V_E + C(V_F - V_E) \quad (4),$$

and $$R_O = R_E + C(R_F - R_E) \quad (5).$$

Referring to FIG. 5A, a current/voltage characteristic linear curve of the lead-acid storage battery at the time it is being discharged is expresses by the following equation (6):

$$V = V_O - R_O I \quad (6)$$

where V is the output voltage of the battery and I the discharging current thereof. By substituting the equations (4) and (5) in the equation (6), the following equation (7) is obtained:

$$\begin{aligned} V &= V_E + C(V_F - V_E) - [R_E + C(R_F - R_E)]I \quad (7) \\ &= V_E - R_E I + C[(V_F - V_E) - (R_F - R_E)I]. \end{aligned}$$

A condition in which the equation (7) is satisfied irrespective of the value of the residual capacity C is expressed by:

$(V_F - V_E) - (R_F - R_E)I = 0$, that is, $$I = (V_F - V_E)/(R_F - R_E) \quad (8)$$

Whereupon the following equation (9) is obtained from the equations (7) and (8):

$$\begin{aligned} V &= V_E - R_E \cdot I \quad (9) \\ &= V_E - R_E (V_F - V_E)/(R_F - R_E) \end{aligned}$$

Consequently, the current/voltage characteristic linear curve expressed by the equation (6) passes through a point where the discharging current has a value given by the equation (8) and the output voltage has a value given by the equation (9), regardless of the value of the residual capacity C, and such a point is a reference point to be determined.

For the lead-acid storage battery, therefore, a reference point can be determined according to the equations (8) and (9) from measured values of the open voltages $V_F$, $V_E$ and the internal resistances $R_F$, $R_E$ at the time the battery is fully charged and discharged, respectively.

With the method of estimating the residual capacity of a battery according to the present invention, as described above, that is, in estimating the residual capacity of a battery according to the maximum output estimating process, a reference point is established in advance at the intersection of a plurality of current/voltage characteristic linear curves corresponding to various residual capacities of the battery or in an area in the vicinity of the intersections of the curves, a current/voltage characteristic linear curve is determined so as to pass through the reference point and a measured operating point of the battery which corresponds to discharging current and output voltage values measured when the battery is being discharged, and a maximum transfer power value of the battery is determined from the current/voltage characteristic linear curve thus determined. Even when the discharging current of the battery does not substantially vary, any variations in the determined maximum transfer power value are reduced to increase the accuracy of the maximum transfer power value. Consequently, the residual capacity of the battery can be estimated highly accurately from the maximum transfer power value.

A plurality of sets of discharging current and output voltage values are measured when the battery is being discharged, and a current/voltage characteristic linear curve is determined so as to pass through the reference point and measured operating points of the battery which correspond to the sets of discharging current and output voltage values. In this manner, the accuracy of the maximum transfer power value determined from the current/voltage characteristic linear curve is further increased.

Furthermore, the average of the measured discharging current and output voltage values of the sets is determined, and a current/voltage characteristic linear curve is determined so as to pass through the reference point and an average measured operating point of the battery which corresponds to the average of the measured discharging current values and the average of the measured output voltage values. The calculating process for determining the current/voltage characteristic linear curve can thus be simplified, allowing the residual capacity of the battery to be estimated easily in a short period of time.

Although certain preferred embodiments of the present invention have been shown and described in detail, it should be understood that various changes and modifications may be made therein without departing from the scope of the appended claims.

What is claimed is:

1. A method of estimating the residual capacity in a battery under use, comprising the steps of:
   a) measuring a singe first point of current/voltage characteristic of said battery;
   b) retrieving a stored value of a second current/voltage characteristic point, said stored value obtained from a calibrating procedure, said procedure having obtained said second point as the intersection between current/voltage plots corresponding to various different residual capacities;
   c) extracting the maximum transfer power value from said both first and second current/voltage characteristic points and estimating said residual capacity of said battery from said maximum transfer power value.

2. A method according to claim 1, wherein said calibrating procedure includes the steps of:
   obtaining several current/voltage plots, each plot obtained at a different value of residual capacity, of at least one battery of the same type as said battery under use;
   obtaining, from said points, a common intersection point and storing its value as said second current/voltage characteristic point.

3. A method according to claim 1, wherein said step of extracting the maximum transfer power includes determining a current/voltage characteristic linear curve by a line through said first and second current/voltage characteristic points.

4. A method according to claim 3, further comprising steps of:
   measuring a plurality of current/voltage characteristic points of said battery during a present discharge of the battery; and
   determining a present current/voltage characteristic linear curve so as to pass through said second current/voltage characteristic plurality of current/voltage characteristic points.

5. A method according to claim 4, further comprising the steps
   determining the average of the plurality of measured current/voltage characteristic points during said present discharge; and
   determining said present current/voltage characteristic linear curve so as to pass through said second current/voltage characteristic point and an average measured operating point of said battery which corresponds to said determined avenge of the plurality of measured current/voltage characteristic points during discharging of said battery.

6. A method according to claim 3, further comprising the step of:
   determining said current/voltage characteristic linear curve with said first current/voltage characteristic point being determined from a plurality of measured current/voltage voltage characteristic points by a method of least squares.

7. A method according to claim 1, further comprising a step of establishing said second current/voltage characteristic point by making a plurality of sets of measurements of discharging current and output voltage for the battery under varying temperature conditions for developing a plurality of current/voltage characteristic linear curves.

8. A method according to claim 1, further comprising a step of establishing said second current/voltage characteristic point by measuring an open voltage and an internal resistance of the battery in both a fully charged state and a rally discharged state for locating said second current/voltage characteristic point on a predetermined current/voltage characteristic linear curve of the battery.

9. A method according to claim 8, wherein said predetermined current/voltage characteristic linear curve is based on a discharging state of the battery expressed by $V=V_O-R_O 1$ where V is output voltage of the battery, 1 is output current, $V_O$ is the open voltage and $R_O$ is the internal resistance of the battery.

10. A method according to claim 1, wherein said calibrating procedure includes developing a plurality of current/voltage characteristic linear curves by measuring the discharging current and output voltage of a test battery of the same type as said battery under use under varying values of discharging current and varying values of battery capacity.

11. A method according to claim 10, wherein said plurality of current/voltage characteristic linear curves are projected beyond the actual measured values of discharge current and output voltage.

12. A method according to claim 11, wherein said second current/voltage characteristic point is at substantially an intersection of said curves in an area of projected curves.

13. A method according to claim 1, wherein said second current/voltage characteristic points is in a range of negative discharge current.

14. A method of calibrating batteries of a given type for later extracting residual capacity values in batteries of the same given type comprising the steps of:
   a) obtaining several current/voltage plots, each plot obtained at a different value of residual capacity;
   b) obtaining, from said plots, a common intersection point and storing its value as a reference point, said reference point adapted to be used later in extracting maximum transfer power values for batteries of said given type.

15. A method according to claim 14, wherein the step of obtaining a reference point includes measuring an open voltage and an internal resistance of a test battery of the given type in both a fully charged state and a fully discharged state for locating the reference point on a predetermined current/voltage characteristic linear curve of said test battery.

16. A method according to claim 14, wherein said several current/voltage plots are developed by measuring the discharging current and output voltage of a test battery of the given type under varying values of discharging current.

17. A method according to claim 14, wherein said several current/voltage plots are projected beyond the actual measured values of discharge current and output voltage.

18. A method according to claim 17, wherein said common intersection of said plots is in an area of projected curves.

19. A method according to claim 14, wherein the reference point is in a range of negative discharge current.

* * * * *

UNITED STATES PATENT AND TRADEMARK OFFICE
CERTIFICATE OF CORRECTION

PATENT NO.  : 5,635,842
DATED       : June 3, 1997
INVENTOR(S) : M. Yokoo et al.

It is certified that error appears in the above-indentified patent and that said Letters Patent is hereby corrected as shown below:

Col. 11, claim 5, line 47, after "steps" insert -- of --.
Col. 11, claim 5, line 55, after "determined" delete "avenge" and insert -- average --.
Col. 11, claim 6, line 64, delete "voltage voltage" and substitute -- voltage --.
Col. 12, claim 8, line 11, delete "rally" and insert -- fully --

Signed and Sealed this

Twenty-second Day of September, 1998

Attest:

BRUCE LEHMAN

Attesting Officer        Commissioner of Patents and Trademarks